United States Patent
Pyo et al.

(10) Patent No.: US 9,293,732 B2
(45) Date of Patent: Mar. 22, 2016

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventors: Sang-Woo Pyo, Yongin (KR); Ji-Hwan Yoon, Yongin (KR); Ha-Jin Song, Yongin (KR); Byeong-Wook Yoo, Yongin (KR); Hyo-Yeon Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 148 days.

(21) Appl. No.: 14/134,447

(22) Filed: Dec. 19, 2013

(65) Prior Publication Data

US 2014/0203256 A1 Jul. 24, 2014

(30) Foreign Application Priority Data

Jan. 24, 2013 (KR) .................. 10-2013-0007763

(51) Int. Cl.
*H01L 27/32* (2006.01)
*H01L 51/52* (2006.01)
*H01L 51/50* (2006.01)

(52) U.S. Cl.
CPC ........ *H01L 51/5265* (2013.01); *H01L 27/3209* (2013.01); *H01L 27/3223* (2013.01); *H01L 51/5088* (2013.01); *H01L 27/3211* (2013.01)

(58) Field of Classification Search
CPC ............ H01L 27/3211; H01L 27/3209; H01L 51/5044; H01L 51/5265
See application file for complete search history.

(56) References Cited

U.S. PATENT DOCUMENTS

| | | | |
|---|---|---|---|
| 7,994,498 B2 * | 8/2011 | Pieh ................... | H01L 27/3209 257/40 |
| 8,878,171 B2 * | 11/2014 | Heo .................... | H01L 51/5044 257/40 |
| 9,006,758 B2 * | 4/2015 | Yoneda ........................... | 257/89 |
| 2007/0141396 A1 | 6/2007 | Chun et al. | |
| 2011/0233604 A1 * | 9/2011 | Ikeda ............................ | 257/103 |
| 2011/0240970 A1 * | 10/2011 | Park et al. ....................... | 257/40 |
| 2012/0098012 A1 * | 4/2012 | Kim .................... | H01L 27/3209 257/98 |
| 2013/0146853 A1 * | 6/2013 | Lee et al. ........................ | 257/40 |
| 2014/0027732 A1 * | 1/2014 | Pyo et al. ........................ | 257/40 |

FOREIGN PATENT DOCUMENTS

| | | |
|---|---|---|
| JP | 2009-129586 | 6/2009 |
| JP | 2011-216778 | 10/2011 |
| KR | 10-2007-0068147 | 6/2007 |

* cited by examiner

*Primary Examiner* — Mohsen Ahmadi
*Assistant Examiner* — Stephen Bradley
(74) *Attorney, Agent, or Firm* — Robert E. Bushnell, Esq.

(57) ABSTRACT

An organic light emitting display device includes a first electrode, a second electrode facing the first electrode, an organic light emitting layer disposed between the first and second electrodes, a first auxiliary structure and a second auxiliary structure both of which are disposed between the first and second electrodes. The first electrode is disposed on a substrate having a first sub-pixel region, a second sub-pixel region and a third sub-pixel region. The organic light emitting layer includes a first organic light emitting layer, a second organic light emitting layer and a third organic light emitting layer. The first auxiliary structure includes a first doping pattern, a first resonance auxiliary pattern, a second doping pattern and a second resonance auxiliary pattern. The second auxiliary structure includes a third doping pattern, a third resonance auxiliary pattern, a fourth doping pattern and a fourth resonance auxiliary pattern.

20 Claims, 7 Drawing Sheets

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 24 Jan. 2013 and there duly assigned Serial No. 10-2013-0007763.

BACKGROUND OF THE INVENTION

1. Field of the Invention

Example embodiments of the present invention relate to an organic light emitting display device and a method of manufacturing the same. Particularly, example embodiments relate to an organic light emitting display device having improved brightness and improved light emission efficiency and a method of manufacturing the same.

2. Description of the Related Art

Organic light emitting display (OLED) devices display information of images or characters by using light generated as holes and electrons, which are provided from an anode and a cathode, respectively, are combined with each other at an organic light emitting layer interposed between the anode and the cathode. The OLED devices have been spotlighted as next-generation display devices because the OLED devices have various advantages such as a wider viewing angle, a rapid response speed, a thinner thickness, and lower power consumption.

SUMMARY OF THE INVENTION

Some example embodiments provide an organic light emitting display device having improved brightness and improved light emission efficiency.

Some example embodiments provide a method of manufacturing an organic light emitting display device having improved brightness and improved light emission efficiency.

However, objects of example embodiments are not limited to the above, but can be variously expanded without departing from the present inventive concept.

According to example embodiments, there is provided an organic light emitting display device including a first electrode, a second electrode, an organic light emitting layer, a first auxiliary structure and a second auxiliary structure. The first electrode is disposed on a substrate having a first sub-pixel region, a second sub-pixel region and a third sub-pixel region. The second electrode faces the first electrode. The organic light emitting layer is disposed between the first electrode and the second electrode. The organic light emitting layer includes a first organic light emitting layer, a second organic light emitting layer and a third organic light emitting layer. The first auxiliary structure is disposed between the first electrode and the second electrode. The first auxiliary structure includes a first doping pattern, a first resonance auxiliary pattern, a second doping pattern and a second resonance auxiliary pattern. The second auxiliary structure is disposed between the first electrode and the second electrode. The second auxiliary structure includes a third doping pattern, a third resonance auxiliary pattern, a fourth doping pattern and a fourth resonance auxiliary pattern.

In example embodiments, the organic light emitting display device may further include an electron injection layer between the organic light emitting layer and the second electrode.

In example embodiments, the organic light emitting display device may further include an electron transfer layer between the organic light emitting layer and the electron injection layer.

In example embodiments, the organic light emitting display device may further include a hole injection layer between the organic light emitting layer and the first electrode.

In example embodiments, the organic light emitting display device may further include a hole transfer layer between the organic light emitting layer and the hole injection layer.

In example embodiments, the first organic light emitting layer may radiate blue light, the second organic light emitting layer may radiate red light, and the third organic light emitting layer may radiate green light.

In example embodiments, the first organic light emitting layer may be disposed in the first sub-pixel region, the second sub-pixel region and the third sub-pixel region, the second organic light emitting layer may be disposed in the first sub-pixel region to overlap the first organic light emitting layer, and the third organic light emitting layer may be disposed in the second sub-pixel region to overlap the first organic light emitting layer.

In example embodiments, the first auxiliary structure may be disposed between the first organic light emitting layer and the second organic light emitting layer.

In example embodiments, the first doping pattern may be disposed to directly contact the first organic light emitting layer, and the second doping pattern may be disposed between the first resonance auxiliary pattern and the second resonance auxiliary pattern.

In example embodiments, a ratio between a thickness of the first resonance auxiliary pattern and a thickness of the second resonance auxiliary pattern may be about 2:1.

In example embodiments, a ratio between a thickness of the first doping pattern and a thickness of the second doping pattern may be about 1:2.

In example embodiments, the second auxiliary structure may be disposed between the first organic light emitting layer and the third organic light emitting layer.

In example embodiments, the third doping pattern may be disposed to directly contact the first organic light emitting layer, and the fourth doping pattern is disposed between the third resonance auxiliary pattern and the fourth resonance auxiliary pattern.

In example embodiments, a ratio between a thickness of the third resonance auxiliary pattern and a thickness of the fourth resonance auxiliary pattern may be about 2:1.

In example embodiments, a ratio between a thickness of the third doping pattern and a thickness of the fourth doping pattern may be about 1:2.

In example embodiments, the organic light emitting display device may further include a thin film transistor electrically connected to the first electrode and a protection layer covering the second electrode.

According to example embodiments, there is provided a method of manufacturing an organic light emitting display device. In the method, a first electrode is formed on a substrate. A first organic light emitting layer is formed on the first electrode. A first auxiliary structure is formed on the first organic light emitting layer. The first auxiliary structure includes a first doping pattern, a first resonance auxiliary pattern, a second doping pattern and a second resonance auxiliary pattern. A second auxiliary structure is formed on the first organic light emitting layer. The second auxiliary structure includes a third doping pattern, a third resonance auxiliary pattern, a fourth doping pattern and a fourth resonance auxiliary pattern. The second auxiliary structure is disposed not to be overlapped with the first auxiliary structure. A second electrode is formed to cover the first organic light emitting layer, the first auxiliary structure and the second auxiliary structure.

In example embodiments, an electron injection layer is formed between the second electrode and the first organic light emitting layer.

In example embodiments, a hole injection layer is formed between the first electrode and the first organic light emitting layer.

In example embodiments, forming the first auxiliary structure may include forming a second doping pattern between the first resonance auxiliary pattern and the second resonance auxiliary pattern. Forming the second auxiliary structure may include forming a fourth doping pattern between the third resonance auxiliary pattern and the fourth resonance auxiliary pattern.

According to example embodiments, an organic light emitting display device may include a first auxiliary structure and a second auxiliary structure. The first auxiliary structure and the second auxiliary structure may include a plurality of doping patterns and a plurality of resonance auxiliary patterns. A first doping pattern and a third doping pattern may increase a carrier mobility between a first organic light emitting layer and resonance auxiliary patterns. A second doping pattern and a fourth doping pattern may increase a carrier mobility between the resonance auxiliary patterns. Accordingly, an electrical property of the organic light emitting display device may be improved, a brightness of the organic light emitting display device may be improved, and a life time of the organic light emitting display device may be extended.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Figure 1:
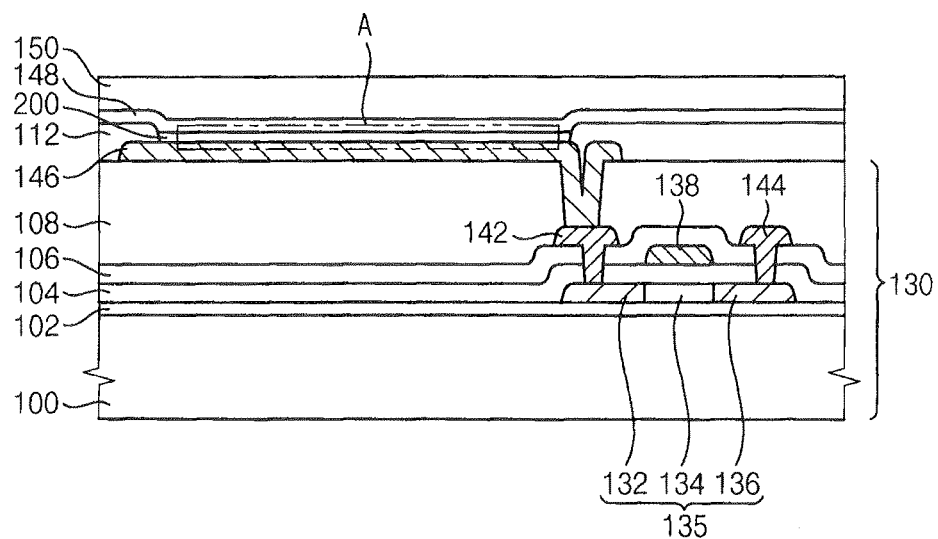
FIG. 1 is a cross-sectional view illustrating an organic light emitting display device in accordance with some embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is cross-sectional view illustrating an organic light emitting display device in accordance with some embodiments.

In reference to FIG. 1, the organic light emitting display device may include a substrate 100, a buffer layer 102, a gate insulation layer 104, a first insulating interlayer 106, a second insulating interlayer 108, a pixel defining layer 112, a transistor 130, a first electrode 146, a second electrode 148, an organic light emitting structure 200 and a protection layer 150.

The substrate 100 may include a transparent insulating substrate. For example, the substrate 100 may include a glass substrate, a quartz substrate, a transparent resin substrate, and the like. In this case, the transparent resin may include a polyimide based resin, an acrylic based resin, a polyacrylate based resin, a polycarbonate based resin, a polyether based resin, a polyethylene terephthalate based resin, a sulfonic acid based resin, and the like.

The buffer layer 102 may be disposed on the substrate 100. The buffer layer 102 may include an insulation material such as silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), and the like. The insulation material may be used alone, or may be used as a mixture thereof. In an example embodiment, the buffer layer 102 may have a multilayer structure, and the multilayer structure may consist of SiOx layer, SiNx layer, SiOxNy layer, SiOxCy layer, SiCxNy layer, and the like.

The buffer layer 102 may prevent an impurities from being diffused from the substrate 100. The buffer layer 102 may adjust a heat transfer rate during a crystallization process of an active pattern 135, so that an electrical property of the active patterns 135 may be improved. Further, the buffer layer 102 may have a flat top surface.

The active pattern 135 may be disposed on the buffer layer 102. In example embodiments, the active pattern 135 may include polysilicon. In other example embodiments, the active pattern 135 may include amorphous semiconductor such as amorphous zinc-indium-tine oxide (ZITO), amorphous indium-gallium-zinc oxide (IGZO), and the like. The active pattern 135 may be divided into a drain contact region 132 contacting a drain electrode 142, a source contact region 136 contacting a source electrode 144, and a channel region 134 between the drain contact region 132 and the source contact region 134.

The gate insulation layer 104 may be disposed on the buffer layer 102 to cover the active pattern 135, thereby insulating the active pattern 135 from a gate electrode 138 and a gate line (not illustrated). The gate insulation layer 104 may include silicon oxide, metal oxide, and the like. For example, the gate insulation layer 104 may include hafnium oxide (HfOx), aluminum oxide (AlOx), zirconium oxide (ZrOx), titanium oxide (TiOx), tantalum oxide (TaOx), and the like. The gate insulation layer 104 may have contact holes which may expose the source contact region 136 and the drain contact region 132.

The gate electrode 138 may be disposed on the gate insulation layer 104. The gate electrode 138 may be disposed to overlap the channel region 134. When a voltage difference is applied between the gate electrode 138 and the source electrode 144, the transistor 130 may be turned on, so that a current may flow through the channel region 134 to the drain electrode 142.

The gate electrode 138 may include a metal, an alloy, a metal nitride, a conductive metal oxide, and the like. For example, the gate electrode 138 may include aluminum (Al), silver (Ag), tungsten (W), tungsten nitride (WNx), copper (Cu), nickel (Ni), chromium (Cr), chromium nitride (CRNx), molybdenum (Mo), titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and mixtures thereof. Further, the gate electrode 138 may have a single layer structure or a multilayer structure.

A gate line (not illustrated) may be formed at the same level as the gate electrode 138, and may be electrically connected to the gate electrode 138.

The first insulating interlayer 106 may be disposed on the gate insulation layer 104 to cover the gate electrode 138 and the gate line. The first insulating interlayer 106 may isolate the gate electrode 138 and the gate line from the source electrode 144 and the drain electrode 142.

The first insulating interlayer 106 may include silicon compound. For example, the first insulating interlayer 106 may include silicon oxide, silicon nitride, silicon oxynitride, silicon carbon nitride, silicon oxy nitride, and the like. The first insulating interlayer 106 may have contact holes exposing the source contact region 136 and the drain contact region 132 of the active pattern 135.

The source electrode 144 and the drain electrode 142 may be disposed on the first insulating interlayer 106. The source electrode 144 and the drain electrode 142 may be disposed through the first insulating interlayer 106 and the gate insulation layer 104, thereby contacting the source contact region 136 and the drain contact region 132, respectively.

The source electrode 144 and the drain electrode 142 may include a metal, an alloy, a metal nitride, a conductive metal oxide, and the like. For example, the source electrode 144 and the drain electrode 142 may include aluminum (Al), silver (Ag), tungsten (W), tungsten nitride (WNx), copper (Cu), nickel (Ni), chromium (Cr), chromium nitride (CrNx), molybdenum (Mo), titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and alloys thereof.

A data line (not illustrated) may be formed at the same level as the source electrode 144 and the drain electrode 144, and may be electrically connected to the source electrode 144.

The second insulating interlayer 108 may be disposed on the first insulating interlayer 106 to cover the source electrode 144, the drain electrode 142 and the data line. The second insulating interlayer 108 may isolate the source electrode 144 from the first electrode 146.

The second insulating interlayer 108 may include an organic insulation material or an inorganic insulation material. For example, the second insulating interlayer 108 may include a photoresist, an acryl based resin, a polyamide based resin, a siloxane based resin, a novolac resin, an alkali-soluble resin, a silicon oxide material, a silicon nitride material, a silicon oxy nitride material, a silicon oxy carbide material, a silicon carbon nitride material, and the like. The second insulating interlayer 108 may have a contact hole exposing the drain electrode 142.

The first electrode 146 may be disposed on the second insulating interlayer 108 in a pixel region, and the first electrode 146 may be electrically connected to the drain electrode 142 through the contact hole of the second insulating interlayer 108.

When the organic light emitting display device has a top emission type, the first electrode 146 may be a reflection electrode. For example, the first electrode 146 may include a metal or an alloy such as aluminum (Al), silver (Ag), platinum (Pt), gold (Au), chromium (Cr), tungsten (W), molybdenum (Mo), titanium (Ti), palladium (Pd), iridium (Ir), and the like. In other example embodiments, the first electrode 146 may include a transparent conductive material such as indium tin oxide, tin oxide, indium zinc oxide, zinc oxide, indium, gallium oxide, gallium oxide, and the like.

The pixel defining layer 112 may be disposed on the second insulating interlayer 108 to partially cover the first electrode 146. The pixel defining layer 112 may include an organic insulating material or an inorganic insulating material. For example, the pixel defining layer 112 may include a photoresist, a polyacryl based resin, a polyimide based resin, an acryl based resin, a silicon compound, and the like. A display region and a non display region of the organic light emitting display device may be defined by the first electrode 146 and the pixel defining layer 112. That is, the first electrode 146 may be exposed by the pixel defining layer 112 in the display region, and the pixel defining layer 112 may be disposed in the non display region.

The organic light emitting structure 200 may be disposed on the second electrode 146, and the second electrode 148 may be disposed to cover the organic light emitting structure 200 and the pixel defining layer 112.

When the organic light emitting display device has a top emission type, the second electrode 148 may be a transparent electrode or a semi transparent electrode. In this case, the second electrode 148 may include a transparent conductive material such as indium tin oxide (ITO), tin oxide (SnOx), indium oxide (InOx), gallium oxide (GaOx), indium zinc oxide (IZO), and the like.

Figure 2:
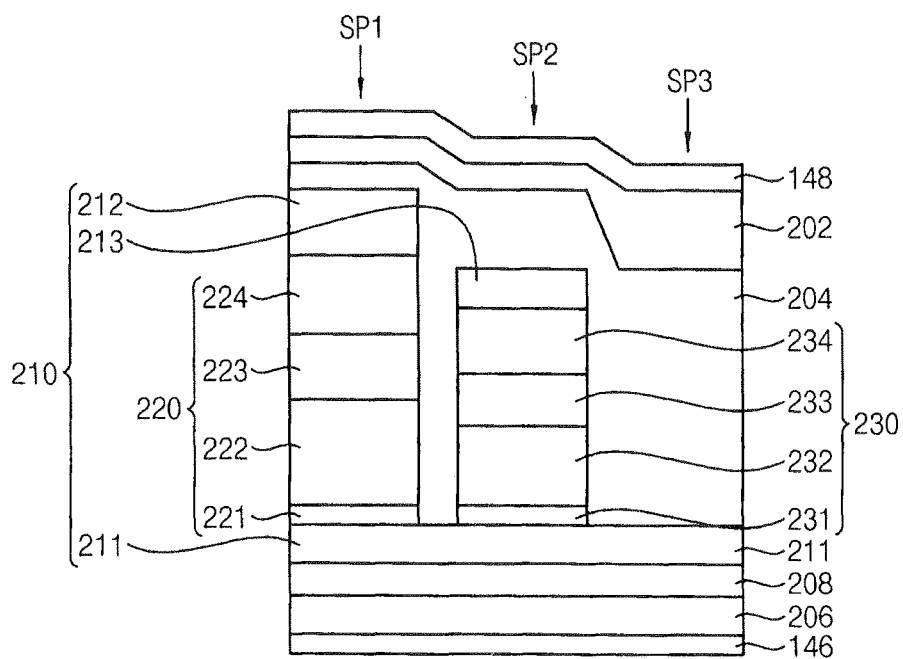
FIG. 2 is an enlarged cross-sectional view of region A of FIG. 1.

FIG. 2 is an enlarged cross-sectional view of region A of FIG. 1.

In reference to FIG. 2, the organic light emitting structure 200 may include an electron injection layer 202, an electron transfer layer 204, a hole injection layer 206, a hole transfer layer 208, an organic light emitting layer 210, first auxiliary structures 220, and second auxiliary structures 230.

The hole injection layer 206 may be disposed on the first electrode 146. The hole injection layer 206 may include CuPc (cupper phthalocyanine), PEDOT (poly(3,4)-ethylenedioxythiophene), PANI (polyaniline), NPD (N,N-dinaphthyl-N, N'-diphenyl benzidine), etc., however, a material in the hole injection layer 206 may not be limited thereto. The hole injection layer 206 may promote a hole injection from the first electrode 146, thereby improving efficiency of the organic light emitting structure 200.

The hole transfer layer 208 may be disposed on the hole injection layer 206. The hole transfer layer 280 may include NPD (N,N-dinaphthyl-N,N'-diphenylbenzidine), TPD (N,N'-bis-(3-methylphenyl)-N,N'-bis-(phenyl)-benzidine), s-TAD, MTDATA (4,4',4"-Tris(N-3-methylphenyl-N-phenyl-amino)-triphenylamine), etc. However, a material in the hole transfer layer 420 may not be limited thereto. The hole transfer layer 208 may improve a movement of holes from the hole injection layer 206.

The organic light emitting layer 210 may be disposed on the hole transfer layer 208. The organic light emitting layer 210 may include a first organic light emitting layer 211, a second organic light emitting layer 212 and a third organic light emitting layer 213. The first organic light emitting layer 211 may substantially emit blue light, the second organic light emitting layer 212 may substantially emit red light, and the third organic light emitting layer 213 may substantially emit green light.

In example embodiments, the first organic light emitting layer 211 may be disposed in the first sub-pixel region (SP1), the second sub-pixel region (SP2) and the third sub-pixel region (SP3). In one embodiment, the first sub-pixel region is adjacent to the second sub-pixel region and the second sub-pixel region is adjacent to the third sub-pixel region. The first organic light emitting layer 211 may include blue dopants, such as oxadiazole dimer dyes (Bis-DAPOXP), spiro compounds (Spiro-DPVBi, Spiro-6P), triarylamine compounds, bis(styryl)amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)(BCzVB), 4,4-bis[4-(di-p-tolylamino)styryl]biphenyl (DPAVBi), 4-(di-p-tolylamino)-4'-[(di-p-tolylamino)styryl]stilben (DPAVB), 4,4'-bis[4-(diphenylamino) styryl]biphenyl (BDAVBi), and bis(3,5-difluoro-2-(2-pyridyl)phenyl-(2-carboxypyridyl)iridium III (FIrPic). The first organic light emitting layer 211 may further include a polymer light emitting material such as polyfluorene based polymer, polyvinyl based polymer, and the like.

In example embodiments, the second organic light emitting layer 212 may be disposed in the first sub-pixel region (SP1). The second organic light emitting layer 212 may include red dopants, such as tetraphenylnaphthacene (Rubrene), tris(1-phenyl-isoquinoline)iridium (III) (Ir(piq)3), bis (2-benzo[b]thiophen-2-yl-pyridine)(acetylacetonate)iridium (III) (Ir(btp)$_2$(acac)), tris(dibenzoylmethane)phenanthroline europium (III) (Eu(dbm)$_3$(phen)), tris[4,4'-di-tert-butyl-(2, 2')-bipyridine]ruthenium (III) complex (Ru(dtb-bpy)$_3$*2 (PF$_6$)), DCM1, DCM2, europium(thenoyltrifluoroacetone)3 (Eu(TTA)3), and butyl-6-(1,1,7,7-tetramethyljulolidyl-9-enyl)-4H-pyran (CJTB). The second organic light emitting layer 212 may further include a polymer light emitting material such as polyfluorene based polymer, polyvinyl based polymer, and the like.

In example embodiments, the third organic light emitting layer 213 may be disposed in the second sub-pixel region (SP2). The third organic light emitting layer 213 may include green dopants, such as 3-(2-benzothiazolyl)-7-(diethylamino)coumarin (Coumarin 6) 2,3,6,7-tetrahydro-1,1,7,7-tetramethyl-1H,5H,11H-10-(2-benzothiazolyl)quinolizino-[9,9a,1gh]coumarin (C545T), N,N'-dimethyl-quinacridone (DMQA), and tris(2-phenylpyridine)iridium(III) (Ir(ppy)3). The third organic light emitting layer 213 may further include a polymer light emitting material such as polyfluorene based polymer, polyvinyl based polymer, and the like.

In reference now to FIG. 2, the first auxiliary structure 220 may be disposed in the first sub-pixel region (SP1) on the first organic light emitting layer 211. Particularly, the first auxiliary structure 220 may include a first doping pattern 221, a first resonance auxiliary pattern 222, a second doping pattern 223 and a second resonance auxiliary pattern 224 which may be stacked sequentially.

The first doping pattern 221 may be disposed in the first sub-pixel region (SP1) on the first organic light emitting layer 211. The first doping pattern 221 may include a material substantially the same as that of the hole injection layer 206. Then, P-type impurities may be doped into the first doping pattern 221. For example, the P-type impurities may include F$_4$-TCNQ, FECL$_3$, and the like.

The first resonance auxiliary pattern 222 may be disposed on the first doping pattern 221. The first resonance auxiliary pattern 222 may have a predetermined thickness and a predetermined refractive index, such that an optical resonance distance in the first sub-pixel region (SP1) is adjusted to generate an optical resonance for red light generated in the organic light emitting layer 210. The first resonance auxiliary pattern 222 may include a material such as SiN, SiO, TiO$_2$, Ta$_2$O$_5$, ITO, IZO, and the like for adjusting the optical resonance distance. In an example embodiment, the first resonance auxiliary pattern 222 may further include a metal or an alloy such as Ag, MgAg, and the like.

The second doping pattern 223 may be disposed on the first resonance auxiliary pattern 222. The second doping pattern 223 may include a material substantially the same as that of the hole injection layer 206. Then, P-type impurities may be doped into the second doping pattern 223. For example, the P-type impurities may include F$_4$-TCNQ, FECL$_3$, and the like.

The second resonance auxiliary pattern 224 may be disposed on the second doping pattern 223. The second resonance auxiliary pattern 224 may have a predetermined thickness and a predetermined refractive index, such that an optical resonance distance in the first sub-pixel region (SP1) is adjusted to generate an optical resonance for red light generated in the organic light emitting layer 210. The second resonance auxiliary pattern 224 may include a material such as SiN, SiO, $TiO_2$, $Ta_2O_5$, ITO, IZO, and the like for adjusting the optical resonance distance. In an example embodiment, the second resonance auxiliary pattern 224 may further include a metal or an alloy such as Ag, MgAg, and the like.

A ratio between a thickness of the first resonance auxiliary pattern 222 and a thickness of the second resonance auxiliary pattern 224 may be in a range of about 1:1 to about 3:1. In an example embodiment, the ratio between the thickness of the first resonance auxiliary pattern 222 and the thickness of the second resonance auxiliary pattern 224 may be about 2:1.

A ratio between a thickness of the first doping pattern 221 and a thickness of the second doping pattern 223 may be in a range of about 1:1 to about 1:3. In an example embodiment, the ratio between the thickness of the first doping pattern 221 and the thickness of the second doping pattern 223 may be about 1:2.

In reference now to FIG. 2, the second auxiliary structure 230 may be disposed in the second sub-pixel region (SP2) on the first organic light emitting layer 211. Particularly, the second auxiliary structure 230 may include a third doping pattern 231, a third resonance auxiliary pattern 232, a fourth doping pattern 233 and a fourth resonance auxiliary pattern 234 which may be stacked sequentially.

The third doping pattern 231 may be disposed in the second sub-pixel region (SP2) on the first organic light emitting layer 211. The third doping pattern 231 may include a material substantially the same as that of the hole injection layer 206. Then, P-type impurities may be doped into the third doping pattern 231. For example, the P-type impurities may include $F_4$-TCNQ, $FECL_3$, and the like.

The third resonance auxiliary pattern 232 may be disposed on the third doping pattern 231. The third resonance auxiliary pattern 232 may have a predetermined thickness and a predetermined refractive index, such that an optical resonance distance in the second sub-pixel region (SP2) is adjusted to generate an optical resonance for green light generated in the organic light emitting layer 210. The third resonance auxiliary pattern 232 may include a material such as SiN, SiO, $TiO_2$, $Ta_2O_5$, ITO, IZO, and the like for adjusting the optical resonance distance. In an example embodiment, the third resonance auxiliary pattern 232 may further include a metal or an alloy such as Ag, MgAg, and the like.

The fourth doping pattern 233 may be disposed on the third resonance auxiliary pattern 232. The fourth doping pattern 233 include a material substantially the same as that of the hole injection layer 206. Then, P-type impurities may be doped into the fourth doping pattern 233. For example, the P-type impurities may include $F_4$-TCNQ, $FECL_3$, and the like.

The fourth resonance auxiliary pattern 234 may be disposed on the fourth doping pattern 233. The fourth resonance auxiliary pattern 234 may have a predetermined thickness and a predetermined refractive index, such that an optical resonance distance in the second sub-pixel region (SP2) is adjusted to generate an optical resonance for green light generated in the organic light emitting layer 210. The fourth resonance auxiliary pattern 234 may include a material such as SiN, SiO, $TiO_2$, $Ta_2O_5$, ITO, IZO, and the like for adjusting the optical resonance distance. In an example embodiment, the fourth resonance auxiliary pattern 234 may further include a metal or an alloy such as Ag, MgAg, and the like.

A ratio between a thickness of the third resonance auxiliary pattern 232 and a thickness of the fourth resonance auxiliary pattern 234 may be fixed at about 1:1 to about 3:1. In an example embodiments, the ratio between the thickness of the third resonance auxiliary pattern 232 and the thickness of the fourth resonance auxiliary pattern 234 may be fixed at about 2:1.

A ratio between a thickness of the third doping pattern 231 and a thickness of the fourth doping pattern 233 may be fixed at about 1:1 to about 3:1. In an example embodiments, the ratio between the thickness of the third doping pattern 231 and the thickness of the fourth doping pattern 233 may be fixed at about 2:1.

The electron transfer layer 204 may be disposed on the organic light emitting layer 210. The electron transfer layer 204 may include $Alq_3$. The electron transfer layer 204 may enhance a movement of electrons to the organic light emitting layer 210.

The electron injection layer 202 may be disposed on the electron transfer layer 204. The electron injection layer 202 may include PBD, PF-6P, PyPySPyPy, LiF, NaCl, CaF, $Li_2O$, BaO, Liq, and the like. The electron injection layer 202 may promote an electron injection from the second electrode 148, thereby improving efficiency of the organic light emitting structure 200.

The hole injection layer 206, the hole transfer layer 208, the electron transfer layer 204 and the electron injection layer 202 may improve an electrical property of the organic light emitting display device 200, so that a brightness of the organic light emitting display device 200 may be improved, and a life time of the organic light emitting layer 210 may be extended.

In other example embodiments, at least one of the hole injection layer 206, the hole transfer layer 208, the electron transfer layer 204 and the electron injection layer 202 may be omitted as necessary.

The second electrode 148 may be disposed on the organic light emitting display device 200. The second electrode 148 may include a transparent conductive material such as indium tin oxide, tin oxide, indium zinc oxide, zinc oxide, indium, gallium oxide, gallium oxide, and the like. In other example embodiments, the second electrode 148 may include a metal or an alloy such as aluminum (Al), silver (Ag), platinum (Pt), gold (Au), chromium (Cr), tungsten (W), molybdenum (Mo), titanium (Ti), palladium (Pd), iridium (Ir), and the like.

In reference now to FIG. 1, the protection layer 150 may be disposed on the second electrode 148. In an example embodiment, the protection layer may include a photoresist, an acrylic based resin, a polyimide based resin, a polyamide based resin, a siloxane based resin, and the like. In other example embodiments, the protection layer 150 may include a transparent insulation substrate. The transparent insulation substrate may include a glass substrate, a quartz substrate, a transparent resin substrate.

FIGS. 3 through 12 are cross-sectional views illustrating a method of manufacturing an organic light emitting display device of FIG. 2.

Figure 3:
FIGS. 3 through 12 are cross-sectional views illustrating a method of manufacturing an organic light emitting display device in accordance with some embodiments.

FIG. 3 is a cross-sectional view illustrating a step of forming a hole injection layer 206 on a first electrode 146.

In an example embodiment, the hole injection layer 206 may be formed using CuPc (cupper phthalocyanine), PEDOT (poly(3,4)-ethylenedioxythiophene), PANI (polyaniline), NPD (N,N-dinaphthyl-N,N'-diphenyl benzidine), and the like. The hole injection layer 206 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like.

When the hole injection layer 206 may be formed by the mask deposition process, a mask exposing the first electrode 146 may be arranged above a substrate having the first electrode 146, and then a target may be heated or sputtered to form the hole injection layer 206 on the first electrode 146 exposed by the mask.

Figure 4:

FIG. 4 is a cross-sectional view illustrating a step of forming a hole transfer layer 208 on the hole injection layer 206.

In an example embodiment, the hole transfer layer 208 may be formed using NPD (N,N-dinaphthyl-N,N'-diphenylbenzidine), TPD (N,N'-bis-(3-methylphenyl)-N,N'-bis-(phenyl)-benzidine), s-TAD, MTDATA (4,4',4"-Tris(N-3-methylphenyl-N-phenyl-amino)-triphenylamine), etc. The hole transfer layer 208 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In example embodiments, the hole transfer layer 208 may be formed by the mask deposition process.

Figure 5:

FIG. 5 is a cross-sectional view illustrating a step of forming a first organic light emitting layer 211 on the hole transfer layer 208.

In example embodiments, the first organic light emitting layer 211 may be formed using a material containing blue dopants. The first organic light emitting layer 211 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the first organic light emitting layer 211 may be formed by the mask deposition process. In other example embodiment, the first organic light emitting layer 211 may be formed to have a multi layer structure.

Figure 6:
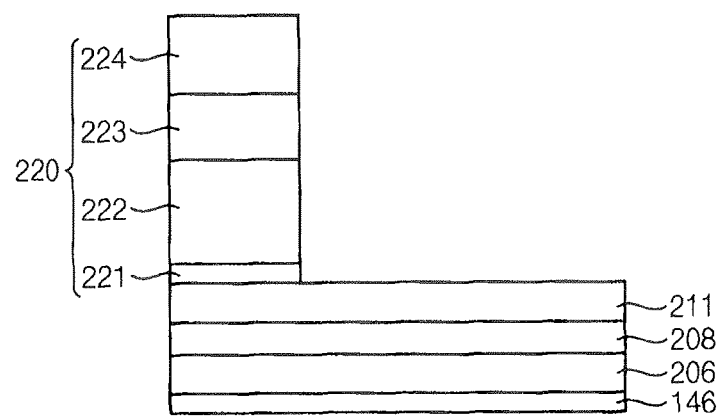

FIG. 6 is a cross-sectional view illustrating a step of forming a first auxiliary structure 220 on the first organic light emitting layer 211.

The first auxiliary structure 220 may be formed in the first sub-pixel region (SP1). Particularly, the first auxiliary structure 220 may include a first doping pattern 221, a first resonance auxiliary pattern 222, a second doping pattern 223 and a second resonance auxiliary pattern 224 which may be stacked sequentially.

The first doping pattern 221 may be formed in the first sub-pixel region (SP1) on the first organic light emitting layer 211. The first doping pattern 221 may be formed using a material substantially the same as that of the hole injection layer 206. Then, P-type impurities may be doped into the first doping pattern 221. For example, the P-type impurities may include $F_4$-TCNQ, $FECL_3$, and the like.

The first resonance auxiliary pattern 222 may be formed on the first doping pattern 221. The first resonance auxiliary pattern 222 may have a predetermined thickness and a predetermined refractive index, such that an optical resonance distance in the first sub-pixel region (SP1) is adjusted to generate an optical resonance for red light generated in the organic light emitting layer 210. The first resonance auxiliary pattern 222 may include a material such as SiN, SiO, $TiO_2$, $Ta_2O_5$, ITO, IZO, and the like for adjusting the optical resonance distance. In an example embodiment, the first resonance auxiliary pattern 222 may further include a metal or an alloy such as Ag, MgAg, and the like.

The second doping pattern 223 may be disposed on the first resonance auxiliary pattern 222. The second doping pattern 223 may be formed using a material substantially the same as that of the hole injection layer 206. Then, P-type impurities may be doped into the second doping pattern 223. For example, the P-type impurities may include $F_4$-TCNQ, $FECL_3$, and the like.

The second resonance auxiliary pattern 224 may be formed on the second doping pattern 223. The second resonance auxiliary pattern 224 may have a predetermined thickness and a predetermined refractive index, such that an optical resonance distance in the first sub-pixel region (SP1) is adjusted to generate an optical resonance for red light generated in the organic light emitting layer 210. The second resonance auxiliary pattern 224 may include a material such as SiN, SiO, $TiO_2$, $Ta_2O_5$, ITO, IZO, and the like for adjusting the optical resonance distance. In an example embodiment, the second resonance auxiliary pattern 224 may further include a metal or an alloy such as Ag, MgAg, and the like.

A ratio between a thickness of the first resonance auxiliary pattern 222 and a thickness of the second resonance auxiliary pattern 224 may be in a range of about 1:1 to about 3:1. In an example embodiment, the ratio between the thickness of the first resonance auxiliary pattern 222 and the thickness of the second resonance auxiliary pattern 224 may be about 2:1.

A ratio between a thickness of the first doping pattern 221 and a thickness of the second doping pattern 223 may be in a range of about 1:1 to about 1:3. In an example embodiment, the ratio between the thickness of the first doping pattern 221 and the thickness of the second doping pattern 223 may be about 1:2.

The first doping pattern 221, the first resonance auxiliary pattern 222, and the second doping pattern 223, and the second resonance auxiliary pattern 224 may be formed by a laser induced thermal imaging (LITI) process. Therefore, the first doping pattern 221, the first resonance auxiliary pattern 222, and the second doping pattern 223, and the second resonance auxiliary pattern 224 may be formed to have a predetermined shape.

Figure 7:
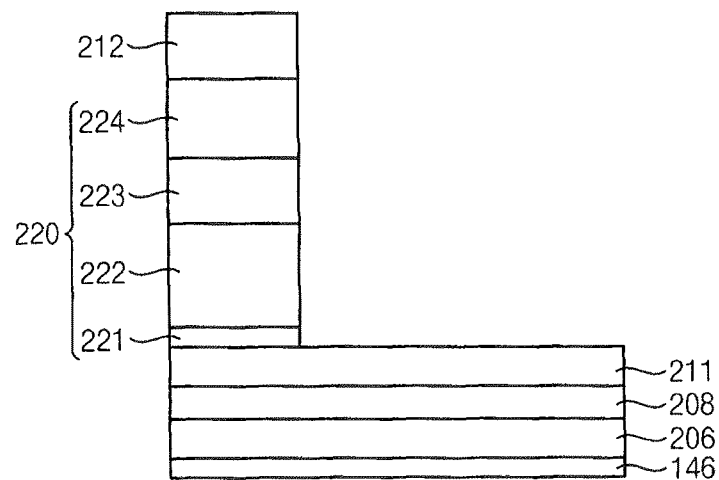

FIG. 7 is a cross-sectional view illustrating a step of forming a second organic light emitting layer 212 on the first auxiliary structure 220.

In example embodiments, the second organic light emitting layer 212 may be formed using a material containing red dopants. The second organic light emitting layer 212 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the second organic light emitting layer 212 may be formed by the mask deposition process. In other example embodiment, the second organic light emitting layer 212 may be formed to have a multi layer structure.

Figure 8:
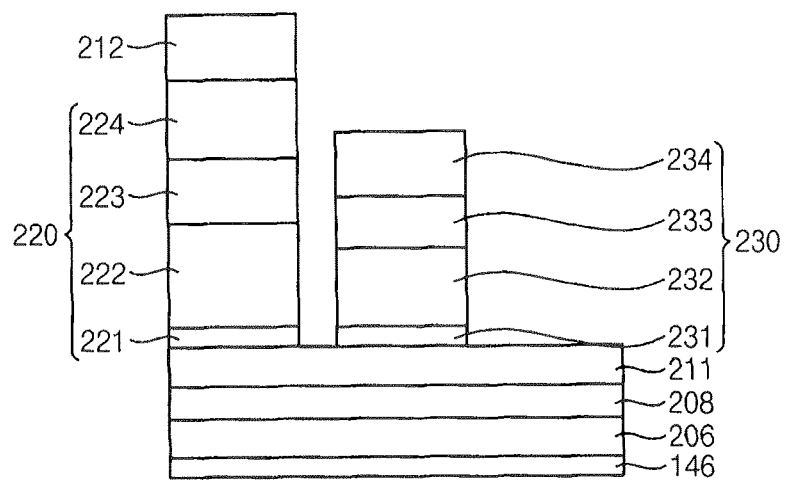

FIG. 8 is a cross-sectional view illustrating a step of forming a second auxiliary structure 230 on the second organic light emitting layer 212.

The second auxiliary structure 230 may be formed in the second sub-pixel region (SP2). Particularly, the second auxiliary structure 230 may include a third doping pattern 231, a third resonance auxiliary pattern 232, a fourth doping pattern 233 and a further resonance auxiliary pattern 234 which may be stacked sequentially.

The third doping pattern 231 may be formed in the second sub-pixel region (SP2) on the first organic light emitting layer 211. The third doping pattern 231 may be formed using a material substantially the same as that of the hole injection layer 206. Then, P-type impurities may be doped into the third doping pattern 231. For example, the P-type impurities may include $F_4$-TCNQ, $FECL_3$, and the like.

The third resonance auxiliary pattern 232 may be formed on the third doping pattern 231. The third resonance auxiliary pattern 232 may have a predetermined thickness and a predetermined refractive index, such that an optical resonance distance in the second sub-pixel region (SP2) is adjusted to generate an optical resonance for green light generated in the organic light emitting layer 210. The third resonance auxiliary pattern 232 may include a material such as SiN, SiO, $TiO_2$, $Ta_2O_5$, ITO, IZO, and the like for adjusting the optical resonance distance. In an example embodiment, the third resonance auxiliary pattern 232 may further include a metal or an alloy such as Ag, MgAg, and the like.

The fourth doping pattern 233 may be formed on the third resonance auxiliary pattern 232. The fourth doping pattern 233 may be formed using a material substantially the same as that of the hole injection layer 206. Then, P-type impurities may be doped into the fourth doping pattern 233. For example, the P-type impurities may include $F_4$-TCNQ, $FECL_3$, and the like.

The fourth resonance auxiliary pattern 234 may be formed on the fourth doping pattern 233. The fourth resonance auxiliary pattern 234 may have a predetermined thickness and a predetermined refractive index, such that an optical resonance distance in the second sub-pixel region (SP2) is adjusted to generate an optical resonance for green light generated in the organic light emitting layer 210. The fourth resonance auxiliary pattern 234 may include a material such as SiN, SiO, $TiO_2$, $Ta_2O_5$, ITO, IZO, and the like for adjusting the optical resonance distance. In an example embodiment, the fourth resonance auxiliary pattern 234 may further include a metal or an alloy such as Ag, MgAg, and the like.

A ratio between a thickness of the third resonance auxiliary pattern 232 and a thickness of the fourth resonance auxiliary pattern 234 may be fixed at about 1:1 to about 3:1. In an example embodiments, the ratio between the thickness of the third resonance auxiliary pattern 232 and the thickness of the fourth resonance auxiliary pattern 234 may be fixed at about 2:1.

A ratio between a thickness of the third doping pattern 231 and a thickness of the fourth doping pattern 233 may be fixed at about 1:1 to about 3:1. In an example embodiments, the ratio between the thickness of the third doping pattern 231 and the thickness of the fourth doping pattern 233 may be fixed at about 2:1.

The third doping pattern 231, the third resonance auxiliary pattern 232, and the fourth doping pattern 233, and the fourth resonance auxiliary pattern 234 may be formed by a laser induced thermal imaging (LITI) process. Therefore, the third doping pattern 231, the third resonance auxiliary pattern 232, and the fourth doping pattern 233, and the fourth resonance auxiliary pattern 234 may be formed to have a predetermined shape.

Figure 9:
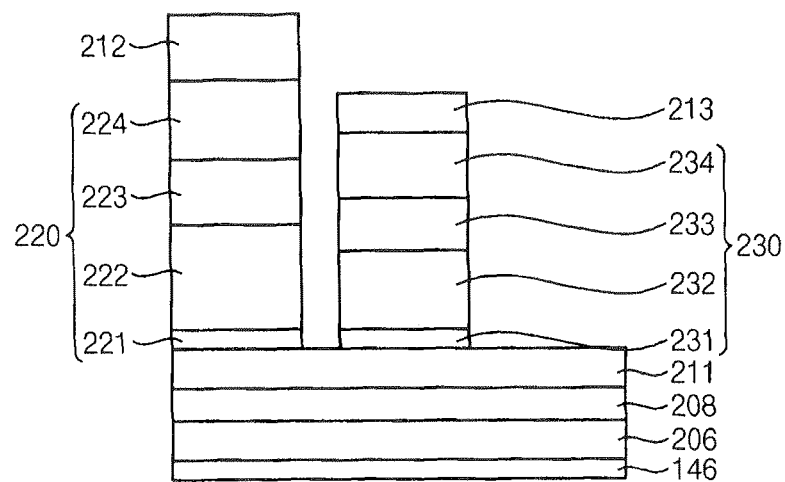

FIG. 9 is a cross-sectional view illustrating a step of forming a third organic light emitting layer 213 on the second auxiliary structure 230.

In example embodiments, the third organic light emitting layer 213 may be formed using a material containing green dopants. The third organic light emitting layer 213 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the third organic light emitting layer 213 may be formed by the mask deposition process. In other example embodiment, the third organic light emitting layer 213 may be formed to have a multi layer structure.

Figure 10:
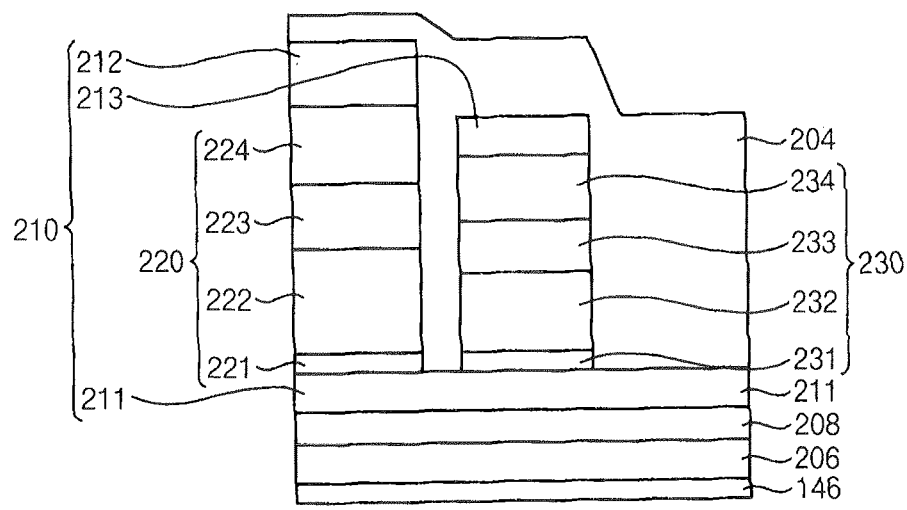

FIG. 10 is a cross-sectional view illustrating a step of forming an electron transfer layer 204 to cover the organic light emitting layer 210.

The electron transfer layer 204 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the electron transfer layer 204 may be formed by the mask deposition process.

Figure 11:
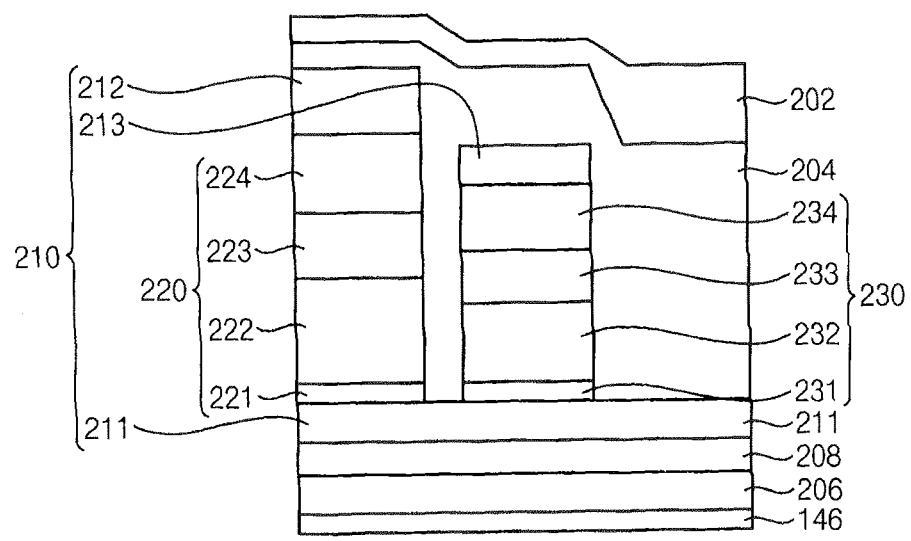

FIG. 11 is a cross-sectional view illustrating a step of forming an electron injection layer 202 on the electron transfer layer 204.

The electron injection layer 202 may be formed using PBD, PF-6P, PyPySPyPy, LiF, NaCl, CaF, $Li_2O$, BaO, Liq, and the like. The electron injection layer 202 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the electron injection layer 202 may be formed by the mask deposition process.

Figure 12:
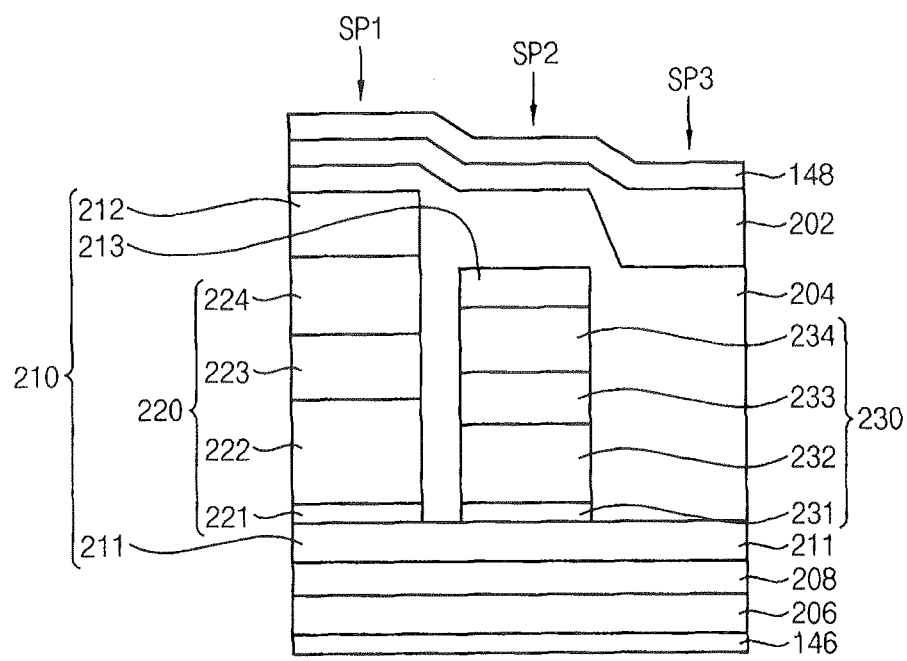

FIG. 12 is a cross-sectional view illustrating a step of forming a second electrode 148 on the electron injection layer 202.

The second electrode 148 may be formed using a conductive material by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like.

When the organic light emitting display device has a top emission type, the first electrode 146 may include a material having a relatively large reflexibility, and the second electrode 148 may include a transparent material.

When the organic light emitting display device has a top emission type, the first electrode 146 may include a material having a relatively large reflexibility, and the second electrode 148 may include a transparent material.

When the organic light emitting display device has a bottom emission type, the first electrode 146 may include a transparent material, and the second electrode 148 may include a material having a relatively large reflexibility.

According to example embodiments, the organic light emitting display device may include the first auxiliary structure 220 and the second auxiliary structure 230. The first auxiliary structure 220 and the second auxiliary structure 230 may include a plurality of doping patterns and a plurality of resonance auxiliary patterns. The first doping pattern 221 and the third doping pattern 231 may increase a carrier mobility between the first organic light emitting layer 221 and resonance auxiliary patterns 222 and 232. The second doping pattern 223 and the fourth doping pattern 233 may increase a carrier mobility between resonance auxiliary patterns. Accordingly, an electrical property of the organic light emitting display device 200 may be improved, a brightness of the organic light emitting display device 200 may be improved, and a life time of the organic light emitting layer 210 may be extended.

Figure 13:
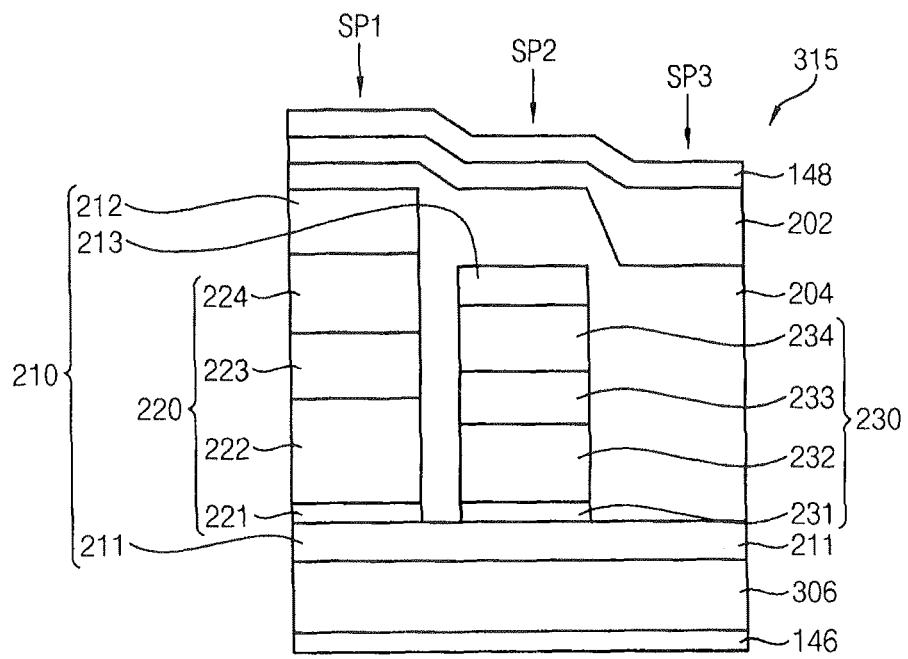
FIG. 13 is a cross-sectional view illustrating an organic light emitting display device in accordance with other embodiments.

FIG. 13 is cross-sectional view illustrating an organic light emitting display device in accordance with other embodiments. The organic light emitting display device may be substantially the same as substantially similar to the organic light emitting display device described with reference to FIGS. 1 through 9. Thus, like reference numerals refer to like elements, and repetitive explanations thereon may be omitted herein In reference to FIGS. 1 and 13, the organic light emitting display device may include a base substrate 100, a buffer layer 102, a gate insulation layer 104, a first insulating interlayer 106, a second insulating interlayer 108, a pixel defining layer 112, a transistor 130, a first electrode 146, a second electrode 148, an organic light emitting structure 315 and a protection layer 150.

Referring to FIG. 1, the organic light emitting structure 315 may be disposed between the first electrode 146 and the second electrode 148. The organic light emitting structure 315 may include an electron injection layer 202, an electron transfer layer 204, an organic light emitting layer 210 and a hole injection layer 206.

The hole injection layer 306 and the organic light emitting layer 210 may be stacked on the first electrode 146. The hole injection layer 306 may be disposed on the first electrode 146. In example embodiments, the hole injection layer 306 may include CuPc (cupper phthalocyanine), PEDOT (poly(3,4)-ethylenedioxythiophene), PANI (polyaniline), NPD (N,N-dinaphthyl-N,N'-diphenyl benzidine), and the like which may be substantially the same as that of the hole injection layer 206 of FIG. 2. In other example embodiments, the hole injection layer 306 may include NPD (N,N-dinaphthyl-N,N'-diphenylbenzidine), TPD (N,N'-bis-(3-methylphenyl)-N,N'-bis-(phenyl)-benzidine), s-TAD, MTDATA (4,4',4"-Tris(N-3-methylphenyl-N-phenyl-amino)-triphenylamine), and the like which may be substantially the same as that of the hole transfer layer 208 of FIG. 2.

The hole injection layer 306 may be formed by a deposition process, a mask deposition process, a photoresist process, a printing process, an ink-jet printing process, a laser induced thermal imaging process and the like. The deposition process may include a sputtering process, a chemical vapor deposition (CVD) process, a pulsed layer deposition process, an evaporation process, an atomic layer deposition process, and the like. In an example embodiment, the hole injection layer 306 may be formed by the mask deposition process.

Then, the organic light emitting layer 210, the electron transfer layer 204 and the electron injection layer 202 may be formed on the hole injection layer 306. The second electrode 148 may be formed on the electron injection layer 202.

According to example embodiments, the hole injection layer 306 may serve to the hole injection layer and the hole transfer layer. Therefore, the manufacturing process may be simplified.

Figure 14:
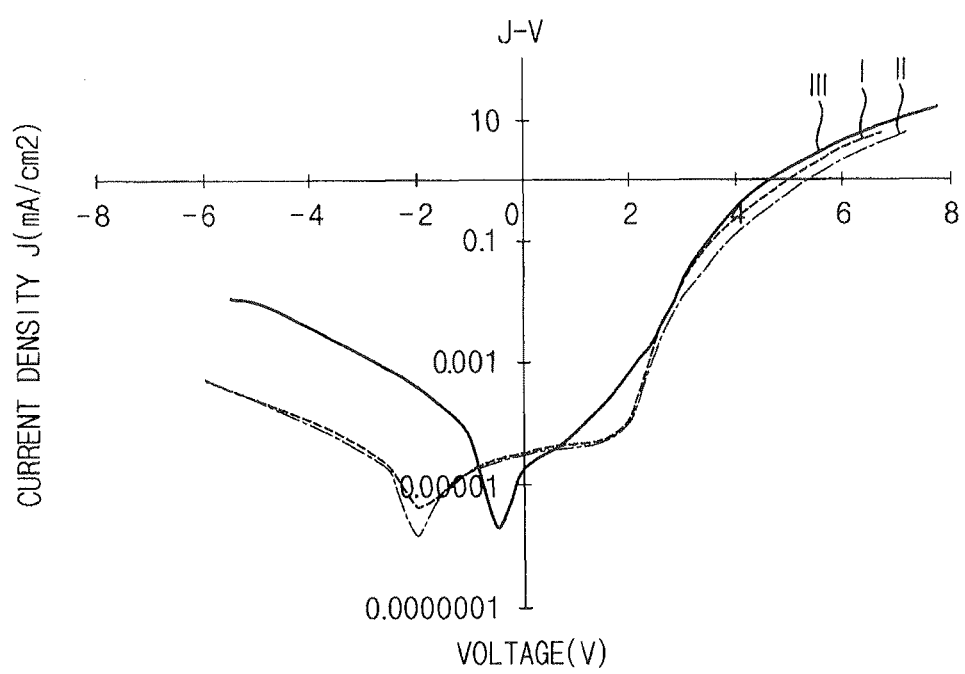
FIG. 14 is a graph illustrating a relation between a voltage and a current density of an organic light emitting display device of FIG. 1.

FIG. 14 is a graph illustrating a relation between a voltage and a current density of an organic light emitting display device of FIG. 1.

In reference to FIG. 14, an example embodiment and comparative example embodiments were performed.

In the example embodiment (I), the organic light emitting structure was substantially the same as the first sub-pixel region of the organic light emitting structure those described with reference to FIG. 2. In this case, the first doping pattern 221 had a thickness of about 5 nm, and the second doping pattern 223 had a thickness of about 10 nm. The ration between a thickness of the first resonance auxiliary pattern 222 and a thickness of the second resonance auxiliary pattern 224 was about 2:1.

In a first comparative example embodiment (II), the organic light emitting structure was substantially the same as the first sub-pixel region of the organic light emitting structure those described with reference to FIG. 2 except for the second doping pattern 223. That is, the second doping pattern 223 was omitted.

In a second comparative example embodiment (III), the organic light emitting structure was substantially the same as the first sub-pixel region of the organic light emitting structure those described with reference to FIG. 2 except for the first auxiliary structure 220. That is, the first auxiliary structure 220 was replaced by a charge generation layer.

Table 1 shows a driving voltage and a efficiency of the example embodiment, the first comparative embodiment and the second comparative embodiment.

TABLE 1

| | Driving voltage (V) | Efficiency (%) | Color coordinate X | Color coordinate Y |
|---|---|---|---|---|
| Example embodiment | 6.5 | 55 | 0.661 | 0.338 |
| First comparative embodiment | 6.5 | 45 | 0.662 | 0.337 |
| Second comparative embodiment | 7.0 | 42 | 0.664 | 0.336 |

In reference to Table 1, the example embodiment shows better efficiency and lower driving voltage compared to the comparative embodiments. That is, the first doping pattern 221 may increase a carrier mobility between the first organic light emitting layer 221 and the first resonance auxiliary pattern 222. The second doping pattern 223 may increase a carrier mobility between the first resonance auxiliary pattern 222 and the second resonance auxiliary pattern 224. Accordingly, an electrical property of the organic light emitting display device may be improved.

The present inventive concept may be applied to a system having an antenna pattern and a window. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device, comprising:
   a first electrode disposed on a substrate having a first sub-pixel region, a second sub-pixel region and a third sub-pixel region;
   a second electrode facing the first electrode;
   an organic light emitting layer disposed between the first electrode and the second electrode, the organic light emitting layer including a first organic light emitting layer, a second organic light emitting layer and a third organic light emitting layer;
   a first auxiliary structure disposed between the first electrode and the second electrode, the first auxiliary structure including a first doping pattern, a first resonance auxiliary pattern, a second doping pattern and a second resonance auxiliary pattern; and
   a second auxiliary structure disposed between the first electrode and the second electrode, the second auxiliary structure including a third doping pattern, a third resonance auxiliary pattern, a fourth doping pattern and a fourth resonance auxiliary pattern.

2. The organic light emitting display device of claim 1, further comprising an electron injection layer disposed between the organic light emitting layer and the second electrode.

3. The organic light emitting display device of claim 2, further comprising an electron transfer layer disposed between the organic light emitting layer and the electron injection layer.

4. The organic light emitting display device of claim 1, further comprising a hole injection layer disposed between the organic light emitting layer and the first electrode.

5. The organic light emitting display device of claim 4, further comprising a hole transfer layer disposed between the organic light emitting layer and the hole injection layer.

6. The organic light emitting display device of claim 1, wherein the first organic light emitting layer radiates blue light, the second organic light emitting layer radiates red light, and the third organic light emitting layer radiates green light.

7. The organic light emitting display device of claim 1, wherein the first organic light emitting layer is disposed in the first sub-pixel region, the second sub-pixel region and the third sub-pixel region, the second organic light emitting layer is disposed in the first sub-pixel region to overlap the first organic light emitting layer, and the third organic light emitting layer is disposed in the second sub-pixel region to overlap the first organic light emitting layer.

8. The organic light emitting display device of claim 7, wherein the first auxiliary structure is disposed between the first organic light emitting layer and the second organic light emitting layer.

9. The organic light emitting display device of claim 8, wherein the first doping pattern is disposed to directly contact the first organic light emitting layer, and the second doping pattern is disposed between the first resonance auxiliary pattern and the second resonance auxiliary pattern.

10. The organic light emitting display device of claim 8, wherein a ratio between a thickness of the first resonance auxiliary pattern and a thickness of the second resonance auxiliary pattern is about 2:1.

11. The organic light emitting display device of claim 8, a ratio between a thickness of the first doping pattern and a thickness of the second doping pattern is about 1:2.

12. The organic light emitting display device of claim 7, wherein the second auxiliary structure is disposed between the first organic light emitting layer and the third organic light emitting layer.

13. The organic light emitting display device of claim 12, wherein the third doping pattern is disposed to directly contact the first organic light emitting layer, and the fourth doping pattern is disposed between the third resonance auxiliary pattern and the fourth resonance auxiliary pattern.

14. The organic light emitting display device of claim 12, wherein a ratio between a thickness of the third resonance auxiliary pattern and a thickness of the fourth resonance auxiliary pattern is about 2:1.

15. The organic light emitting display device of claim 12, wherein a ratio between a thickness of the third doping pattern and a thickness of the fourth doping pattern is about 1:2.

16. The organic light emitting display device of claim 1, further comprising:
   a thin film transistor electrically connected to the first electrode; and
   a protection layer covering the second electrode.

17. A method of manufacturing an organic light emitting display device, the method comprising:
   forming a first electrode on a substrate;
   forming a first organic light emitting layer on the first electrode;
   forming a first auxiliary structure on the first organic light emitting layer, the first auxiliary structure including a first doping pattern, a first resonance auxiliary pattern, a second doping pattern and a second resonance auxiliary pattern;
   forming a second auxiliary structure on the first organic light emitting layer, the second auxiliary structure including a third doping pattern, a third resonance auxiliary pattern, a fourth doping pattern and a fourth resonance auxiliary pattern, the second auxiliary structure being disposed not to be overlapped with the first auxiliary structure; and
   forming a second electrode to cover the first organic light emitting layer, the first auxiliary structure and the second auxiliary structure.

18. The method of claim 17, further comprising forming an electron injection layer between the second electrode and the first organic light emitting layer.

19. The method of claim 17, further comprising forming a hole injection layer between the first electrode and the first organic light emitting layer.

20. The method of claim 17, wherein forming the first auxiliary structure includes forming the second doping pattern between the first resonance auxiliary pattern and the second resonance auxiliary pattern, and forming the second auxiliary structure includes forming the fourth doping pattern between the third resonance auxiliary pattern and the fourth resonance auxiliary pattern.

* * * * *